United States Patent
Hsu et al.

(10) Patent No.: US 7,697,350 B2
(45) Date of Patent: Apr. 13, 2010

(54) LOW COUPLE EFFECT BIT-LINE VOLTAGE GENERATOR

(75) Inventors: Jer-Hau Hsu, Beidou Town, Changhua County (TW); Yung Feng Lin, Taoyuan County (TW)

(73) Assignee: Macronix International Co. Ltd, Hsinchu (TW)

( * ) Notice: Subject to any disclaimer, the term of this patent is extended or adjusted under 35 U.S.C. 154(b) by 131 days.

(21) Appl. No.: 11/967,677

(22) Filed: Dec. 31, 2007

(65) Prior Publication Data

US 2009/0168554 A1    Jul. 2, 2009

(51) Int. Cl.
*G11C 5/14* (2006.01)
(52) U.S. Cl. .................... 365/189.09; 365/149; 365/104
(58) Field of Classification Search ............ 365/189.09, 365/149, 104, 204, 226, 156, 154, 100, 102, 365/205, 185.25
See application file for complete search history.

(56) References Cited

U.S. PATENT DOCUMENTS

| | | | |
|---|---|---|---|
| 6,529,431 B1 * | 3/2003 | Kuo et al. | 365/203 |
| 2004/0027172 A1 * | 2/2004 | Regev et al. | 327/77 |
| 2008/0013394 A1 * | 1/2008 | Wu | 365/226 |

* cited by examiner

*Primary Examiner*—Dang T Nguyen
(74) *Attorney, Agent, or Firm*—Volpe and Koenig, P.C.

(57) ABSTRACT

A bit-line voltage generator is provided. The bit-line voltage generator includes a discharge enhanced bias source and a switch unit. The switch unit includes a clamp transistor having a source, a gate connected to the discharge enhanced bias source, and a drain receiving a voltage; a switch transistor having a gate receiving a control signal, a drain connected to the source of the clamp transistor, and a source connected to a memory array, wherein a parasitic capacitor exists between the gate and the source of the clamp transistor; a resistor having a first terminal connected to the drain of the switch transistor, and a second terminal connected to ground; and a capacitor having a first terminal connected to the drain of the switch transistor, and a second terminal connected to ground, wherein a charge in the parasitic capacitor, when the switch transistor is turned on, is almost identical to that when the switch transistor is turned off, so that a couple effect between the switch unit and the discharge enhanced bias source is reduced, thereby stabilizing a bias applied to the memory array.

13 Claims, 7 Drawing Sheets

LOW COUPLE EFFECT BIT-LINE VOLTAGE GENERATOR

FIELD OF THE INVENTION

The present invention relates to a voltage generator, and more particularly to a low couple effect bit-line voltage generator.

BACKGROUND OF THE INVENTION

The memory is a device for the computer to save data and commands. Please refer to FIG. 1, which is a circuit diagram of the memory bit-line voltage generator in the prior art. The circuit includes a voltage regulator 11 and a switch unit 12. The circuit is used for providing the voltage to a memory array 13, wherein the voltage regulator 11 is connected to the switch unit 12, and the switch unit 12 is connected to the memory array 13. The voltage regulator 11 includes an operational amplifier 111, a pull high transistor Mph and resisters R1, R2. The inverting input terminal of the operational amplifier receives a reference voltage Vref, the noninverting input terminal thereof is connected between the resistors R1, R2, and the output terminal thereof is connected to the gate of the pull high transistor Mph. The source of the pull high transistor receives a voltage Vpp, and the drain thereof is connected to a first terminal of the resistor R1. A first terminal of the resistor R2 is connected to a second terminal of the resistor R1, and a second terminal thereof is connected to ground.

The switch unit 12 includes a switch transistor Msw and a clamp transistor Mclamp. The gate of the switch transistor Msw receives a control signal ø, the drain thereof receives the voltage Vpp, and the source thereof is connected to the drain of the clamp transistor Mclamp. The gate of the clamp transistor Mclamp is connected to the drain of the pull high transistor Mph, and the source thereof is connected to the bit-line of the memory array 13. A parasitic capacitor Cp exists between the gate and the source of the clamp transistor Mclamp. The parasitic capacitor Cp is precharged via the pull high transistor Mph and discharged via the resistors R1, R2. The memory array 13 is composed of a plurality of transistors 131, wherein the gate of each transistor 131 receives a high voltage Vh respectively.

The pull high transistor Mph, the switch transistor Msw, the clamp transistor Mclamp and the transistor 131 described above are MOSFETs.

Please refer to FIG. 2, which is a waveform diagram of respective nodes in the circuit of FIG. 1, wherein Node NB is located between the pull high transistor Mph and the clamp transistor Mclamp, Node NC is located between the switch transistor Msw and the clamp transistor Mclamp, and Node NC is located between the clamp transistor Mclamp and the memory array 13. When the control signal ø is high, the switch transistor Msw is turned on and the voltage V(ND) rises from 0V to 7V, so the charge in the parasitic capacitor Cp must be discharged 7V via the resistors R1, R2. Therefore, when the switch transistor Msw is turned on, an overshoot occurs on the voltage V(NB). However, because the conventional voltage regulator 11 is discharged only via a string of resistors R1, R2, the discharge time thereof is very long. Besides, due to the excessively long finite settling time of the conventional voltage regulator 11, the parasitic capacitor Cp will be over discharged. The above-mentioned issues will cause the voltage V(ND) provided to the bit-line of the memory array 13 to be unstable.

In order to overcome the drawbacks in the prior art, a low couple effect bit-line voltage generator is provided. The particular design in the present invention not only solves the problems described above, but also is easy to be implemented. Thus, the present invention has the utility for the industry.

SUMMARY OF THE INVENTION

In accordance with one aspect of the present invention, a low couple effect bit-line voltage generator is provided for reducing the coupling charge in the coupling source and enhancing the discharge capability of the bias source.

In accordance with another aspect of the present invention, a bit-line voltage generator is provided. The bit-line voltage generator includes a discharge enhanced bias source and a switch unit. The switch unit includes a clamp transistor having a source, a gate connected to the discharge enhanced bias source, and a drain receiving a voltage; a switch transistor having a gate receiving a control signal, a drain connected to the source of the clamp transistor, and a source connected to a memory array, wherein a parasitic capacitor exists between the gate and the source of the clamp transistor; a resistor having a first terminal connected to the drain of the switch transistor, and a second terminal connected to ground; and a capacitor having a first terminal connected to the drain of the switch transistor, and a second terminal connected to ground, wherein a charge in the parasitic capacitor, when the switch transistor is turned on, is almost identical to that when the switch transistor is turned off, so that a couple effect between the switch unit and the discharge enhanced bias source is reduced, thereby stabilizing a bias applied to the memory array.

In accordance with further another aspect of the present invention, a bit-line voltage generator is provided. The bit-line voltage generator includes a discharge enhanced bias source; and a switch unit having a parasitic capacitor and connected between the discharged enhanced bias source and a memory array, wherein a charge in the parasitic capacitor, when the switch transistor is turned on, is almost identical to that when the switch transistor is turned off, so that a couple effect between the switch unit and the discharge enhanced bias source is reduced, thereby stabilizing a bias applied to the memory array.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 3:
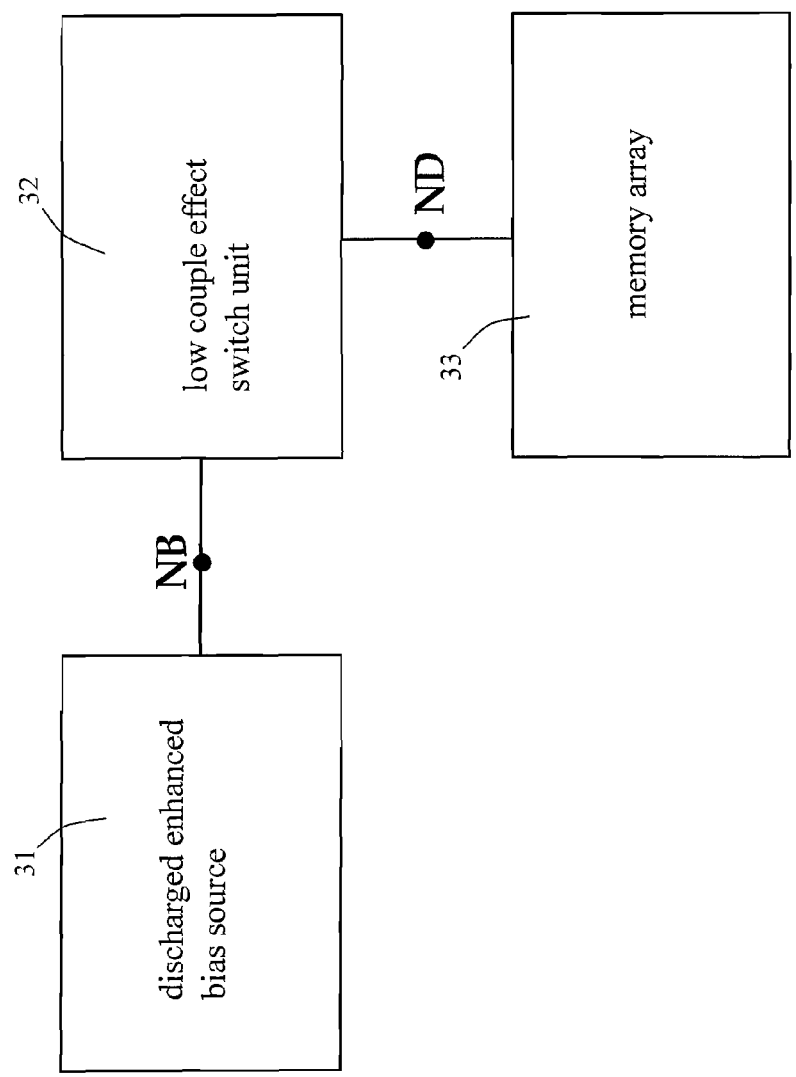
FIG. 3 is a block diagram of the low couple effect bit-line voltage generator in the present invention.

Please refer to FIG. 3, which is a block diagram of the low couple effect bit-line voltage generator in the present invention. The low couple effect bit-line voltage generator includes a discharged enhanced bias source 31 and a low couple effect switch unit 32, wherein the discharged enhanced bias source 31 is connected to the low couple effect switch unit 32, and the low couple effect switch unit 32 is connected to a memory array 33. Node NB is located between the discharge enhanced bias source 31 and the low couple effect switch unit 32, and Node ND is located between the low couple effect switch unit 32 and the memory array 33.

Figure 4:
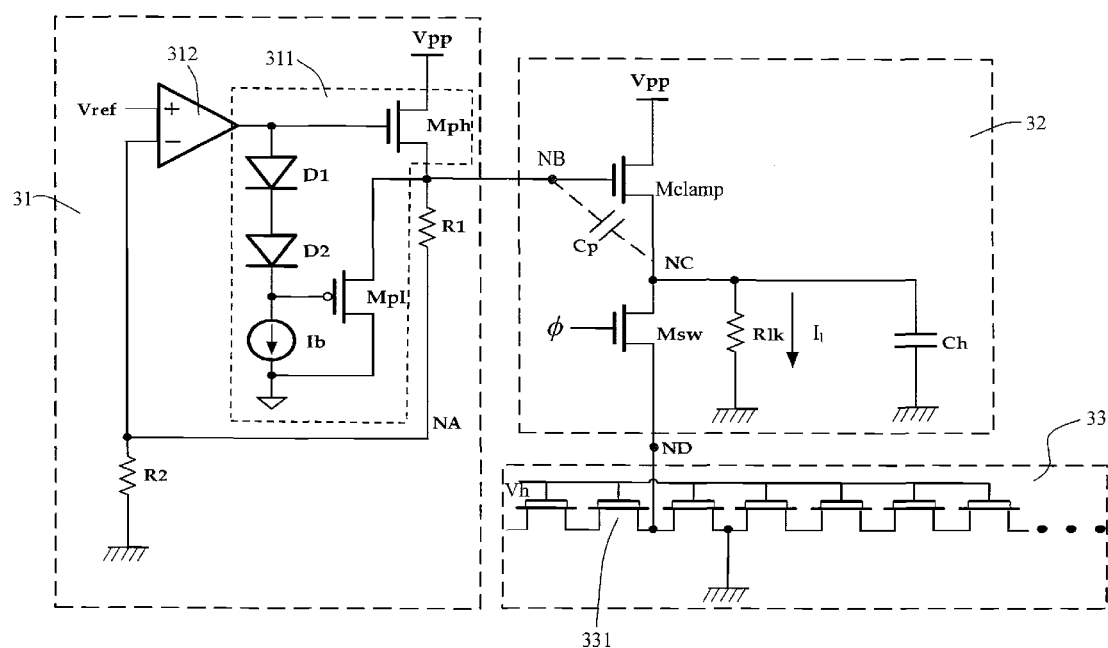
FIG. 4 is a circuit diagram of the low couple effect bit-line voltage generator according to a preferred embodiment of the present invention.

Please refer to FIG. 4, which is a circuit diagram of the low couple effect bit-line voltage generator according to a preferred embodiment of the present invention. The discharge enhanced bias source 31 includes an operational amplifier 312, a class AB output stage 311 and resistors R1, R2. The class AB output stage 311 includes two diodes D1, D2, a current source Ib, a pull high transistor Mph and a pull low transistor Mpl. The noninverting input terminal of the operational amplifier 312 receives a reference voltage Vref, the inverting input terminal thereof is connected a first terminal of the resistor R2, and the output terminal thereof is connected to the anode of the diode D1 and the gate of the pull high transistor Mph respectively. The cathode of the diode D1 is connected to the anode of the diode D2, and the cathode of the diode D2 is connected to the input terminal of the current source Ib. The gate of the pull low transistor Mpl is connected to the input terminal of the current source Ib, the drain thereof is connected to the source of the pull high transistor Mph, and the source thereof is connected with the output terminal of the current source Ib to ground. The gate of the pull high transistor Mph is connected to the output terminal of the operational amplifier 312, the drain thereof receives a voltage Vpp, and the source thereof is connected to a first terminal of the resistor R1. A second terminal of the resistor R1 is connected to the first terminal of the resistor R2, and a second terminal of the resistor R2 is connected to ground.

The low couple effect switch unit 32 includes a clamp transistor Mclamp, a switch transistor Msw, a leakage resistor Rlk and a hold capacitor, wherein a parasitic capacitor exists between the gate and the source of the clamp transistor Mclamp. The gate of the clamp transistor Mclamp is connected to the source of the pull high transistor Mph, the drain thereof receives the voltage Vpp, and the source thereof is connected to the drain of the switch transistor Msw. The gate of the switch transistor Msw receives a control signal, and the source thereof is connected to the bit-line of the memory array 33. A first terminal of the leakage resistor Rlk is connected with a first terminal of the hold capacitor Ch to the drain of the switch transistor Msw, and a second terminal of the leakage resistor Rlk and a second terminal of the hold capacitor Ch are connected to ground respectively.

The pull high transistor Mph, the pull low transistor Mpl, the clamp transistor Mclamp and the switch transistor Msw described above are MOSFETs. The memory array 33 is composed of a plurality of MOSFETs 331, wherein the gate of each MOSFET 331 receives a high voltage Vh respectively.

Besides the discharge path composed of the resistors R1, R2, the pull low transistor Mpl provides another discharge path for speeding up the recover time when the switch transistor Msw is turned on. The diodes D1, D2 and the current source Ib provide the voltage drop to ensure that the pull high transistor Mph and the pull low transistor are slightly turned on simultaneously. The leakage resistor Rlk will cause a small leakage current I1, so the voltage V(NC) when the switch transistor Msw is turned off is near that when the switch transistor Msw is turned on. The hold capacitor Ch can moderate the voltage V(NC) when the switch transistor Msw is turned on.

When the control signal ø is low, the switch transistor Msw is turned off and the voltage V(NC) is a constant value. When the control signal ø is high, the switch transistor Msw is turned on, the voltage V(NC) drops and the voltage V(NB) drops also, so that the discharge enhanced bias source 31 charges the parasitic capacitor Cp. When the voltage V(NC) is stable, the parasitic capacitor Cp is discharged via the discharge path of the discharge enhanced bias source 31.

Figure 1:
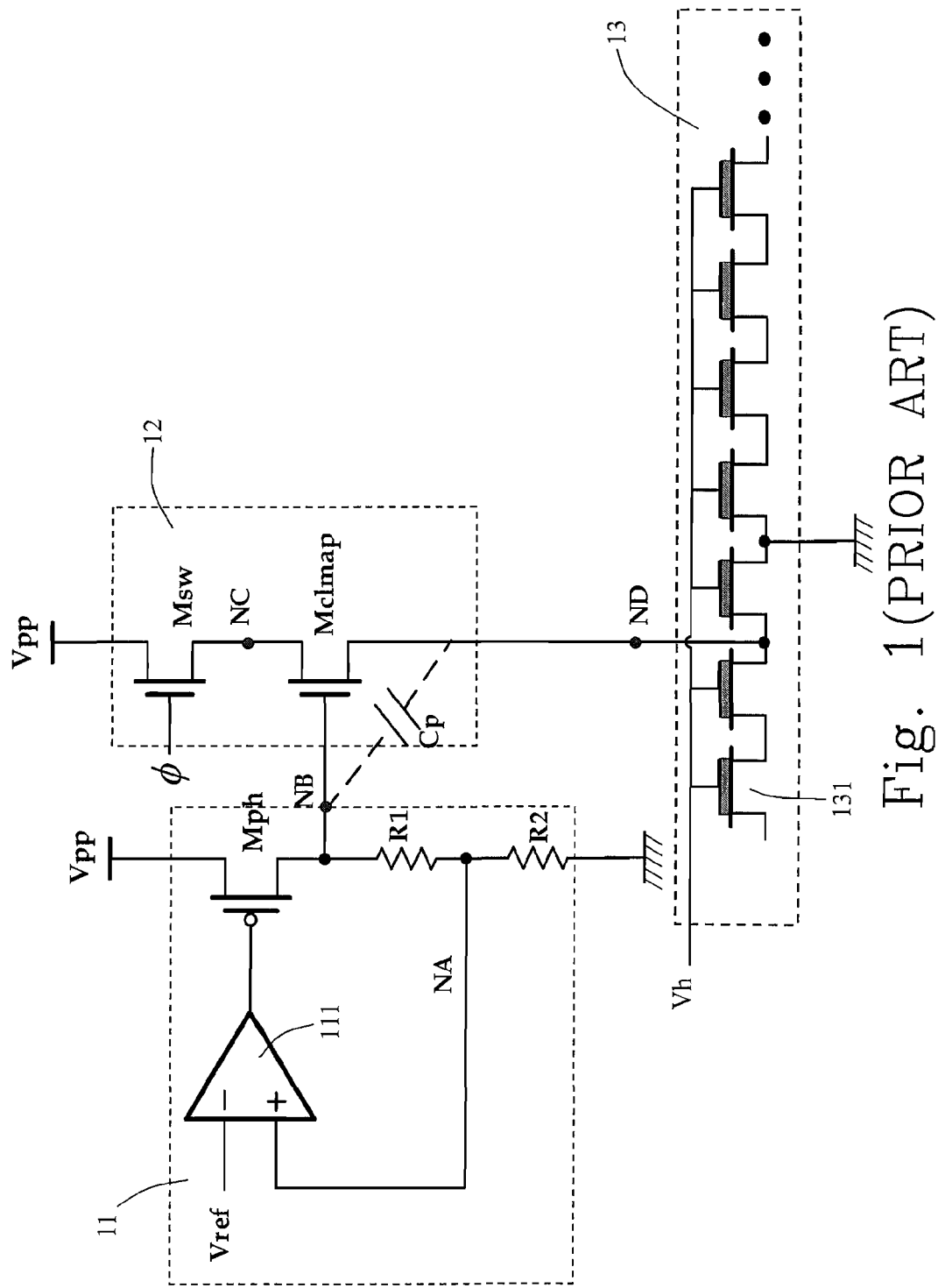
FIG. 1 is a circuit diagram of the memory bit-line voltage generator in the prior art.
Figure 2:
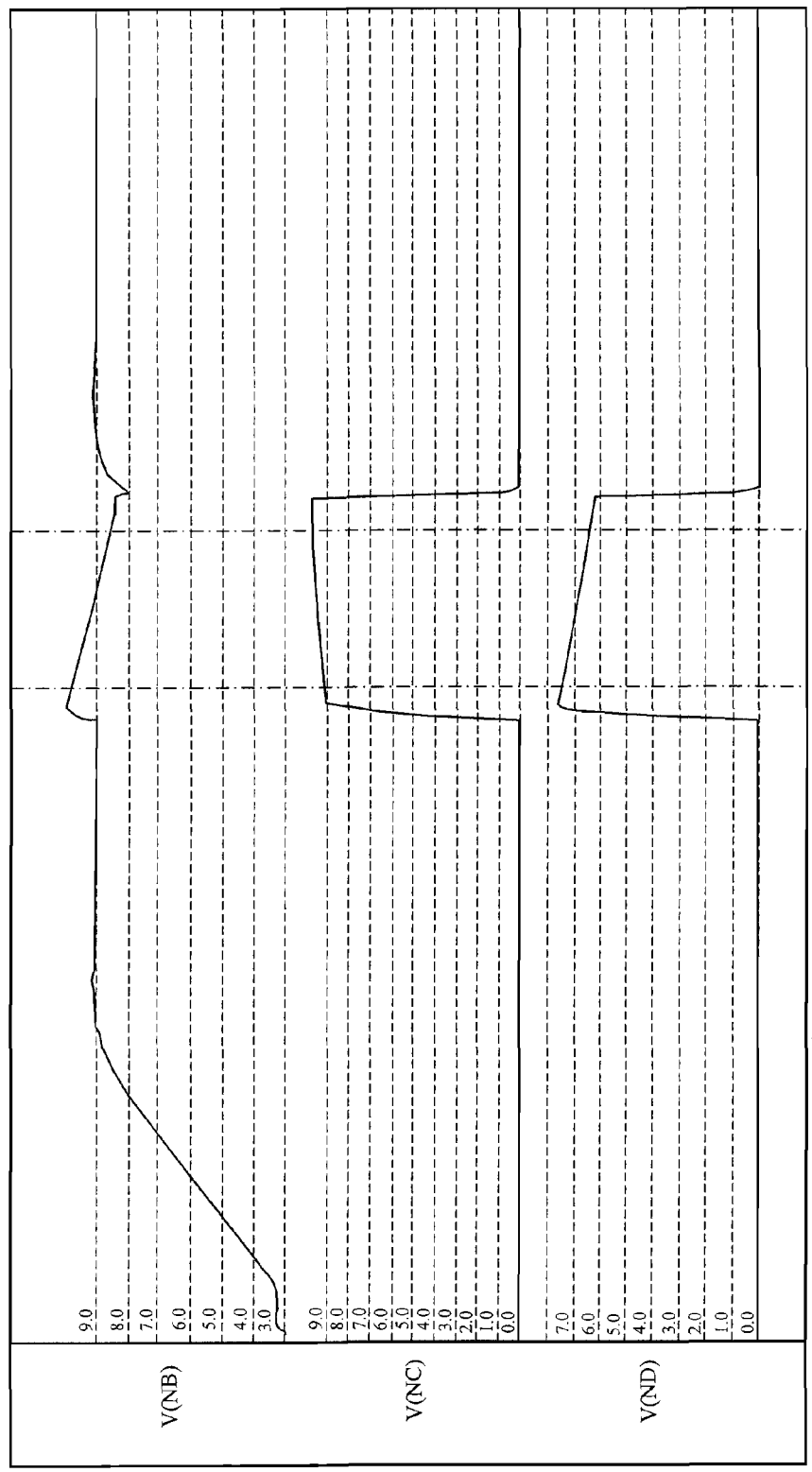
FIG. 2 is a waveform diagram of respective nodes in the circuit of FIG. 1.
Figure 5:
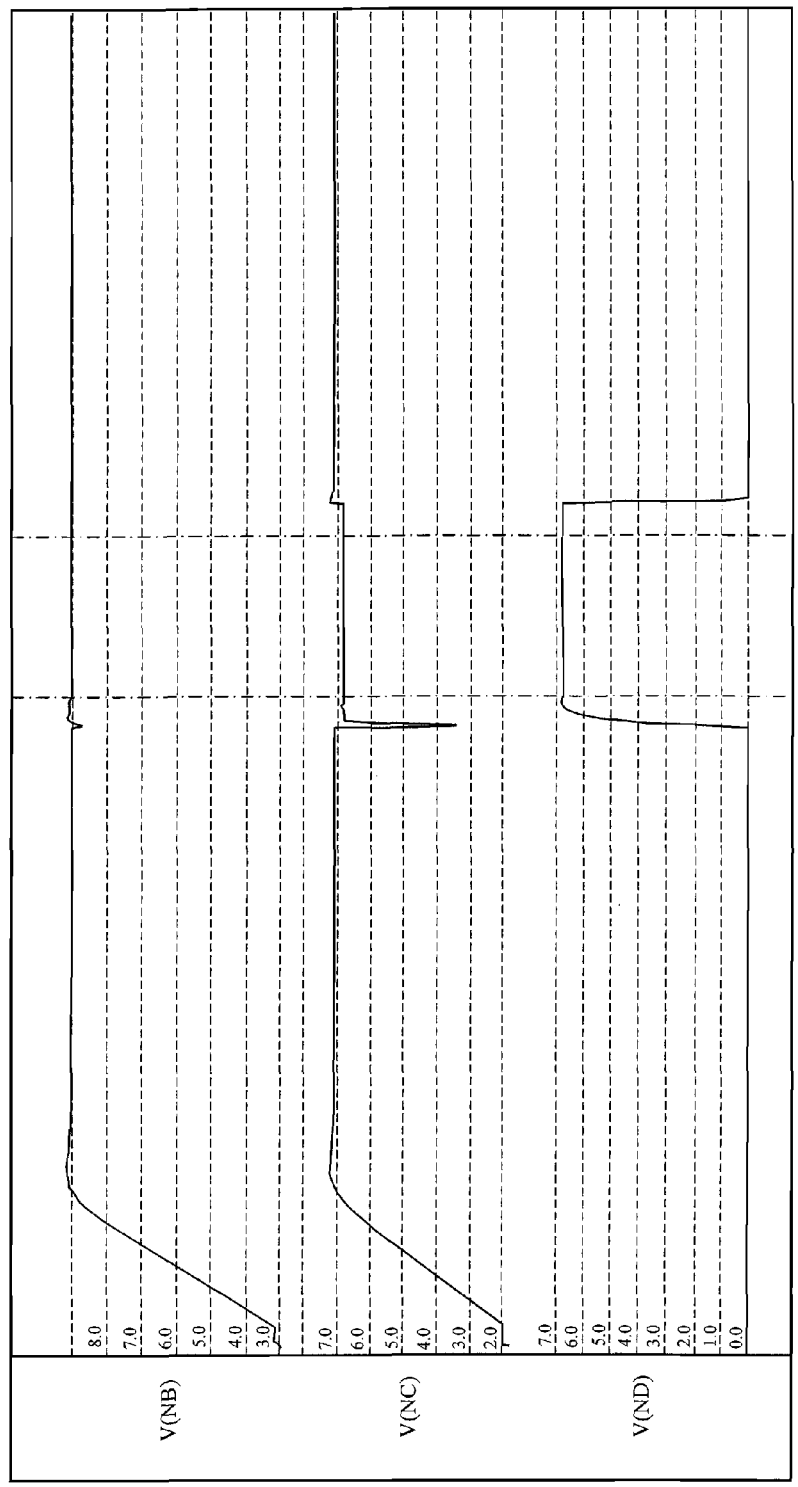
FIG. 5 is a waveform diagram of respective nodes in the circuit of FIG. 2.

Please refer to FIG. 5, which is a waveform diagram of respective nodes in the circuit of FIG. 2. As shown in FIG. 5, when the switch transistor Msw is turned on, the parasitic capacitor needs to be charged about 0.3V. When the switch transistor Msw is turned on, the voltage V(NB) is coupled down following the voltage V(NC), so that the discharge enhanced bias source 31 will charge the parasitic capacitor Cp first. Then, the voltage V(NC) rises to a stable value. However, the voltage V(NB) has a slightly overshoot due to slightly over-charge when it is coupled down. Because the discharge enhanced bias source 31 has strong pull low capability, the parasitic capacitor Cp can be discharged rapidly therethrough, and thus the overshoot of the voltage V(NB) is eliminated rapidly.

The discharge enhanced bias source 31 of the present invention is not limited to the aspect shown in FIG. 4. Any bias source that can accelerate the discharge speed may serve as the discharge enhanced bias source 31 of the present invention.

Figure 6:
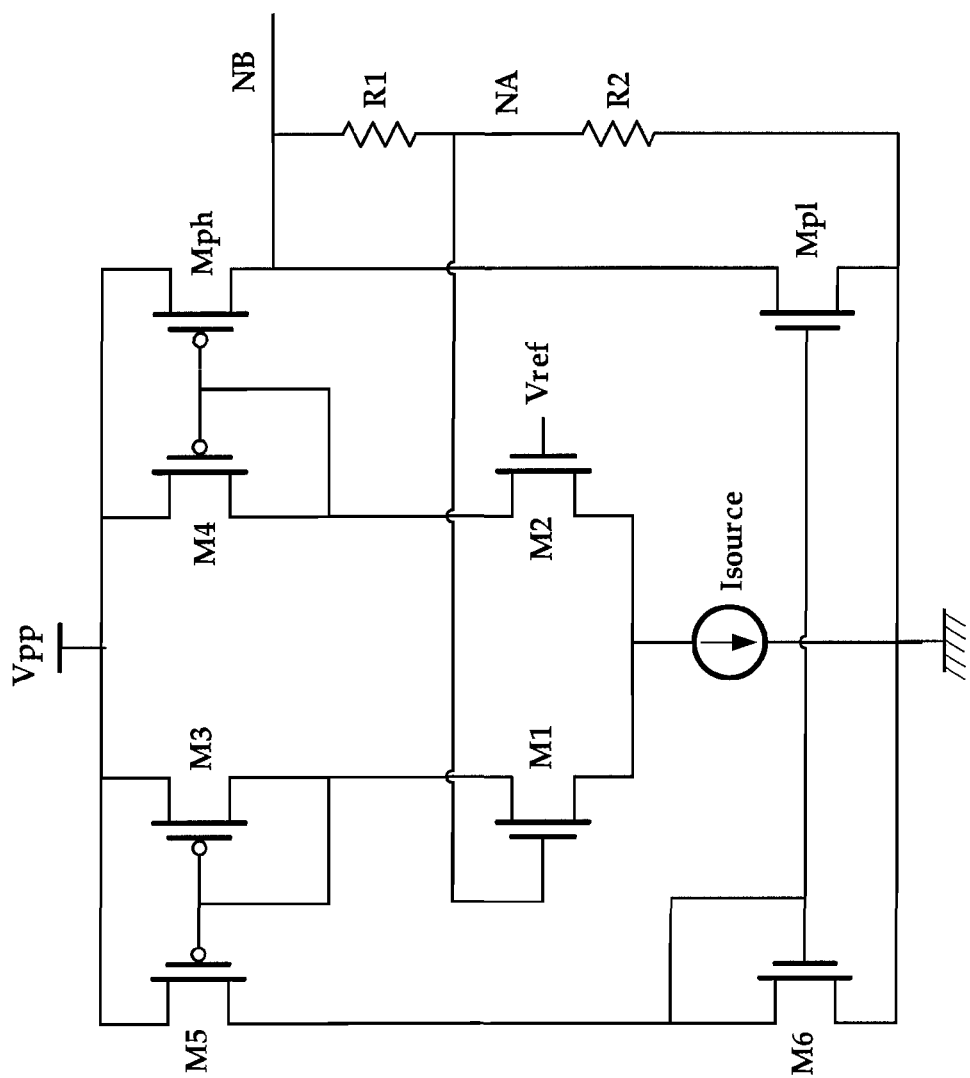
FIG. 6 is a circuit diagram of the discharge enhanced bias source according to another preferred embodiment of the present invention.

Please refer to FIG. 6, which is a circuit diagram of the discharge enhanced bias source according to another preferred embodiment of the present invention. The discharge enhanced bias source 31 includes a current source Isource, a first transistor M1, a second transistor M2, a third transistor M3, a fourth transistor M4, a fifth transistor M5, a sixth transistor M6, a pull high transistor Mph, a pull low transistor Mpl and resistors R1, R2. The input terminal of the current source Isource is connected to the source of the first transistor M1 and the source of the second transistor M2 respectively, and the output terminal is connected to ground. The gate of the first transistor M1 is connected between the resistors R1, R2, and the drain thereof is connected to the source of the third transistor M3. The gate of the second transistor M2 receives a reference voltage Vref, and the drain thereof is connected to the source of the fourth transistor M4. The gate of the third transistor M3 is connected to the source thereof, and the drain thereof receives a voltage Vpp. The gate of the fourth transistor M4 is connected to the source thereof, and the drain thereof receives the voltage Vpp. The gate of the fifth transistor M5 is connected to the gate of the third transistor M3, the drain thereof receives the reference voltage Vpp, and the source thereof is connected to the drain of the sixth transistor M6. The gate of the sixth transistor M6 is connected to the drain thereof, and the source thereof is connected to ground. The gate of the pull high transistor Mph is connected to the gate of the fourth transistor M4, the drain thereof receives the voltage Vpp, and the source thereof is connected to the drain of the pull low transistor Mpl. The gate of the pull low transistor Mpl is connected to the gate of the sixth transistor M6, and the source thereof is connected to ground. A first terminal of the resistor R1 is connected to the source of the pull high transistor Mph, and a second terminal thereof is connected to a first terminal of the resistor R2. A second terminal of the resistor R2 is connected to ground.

The first transistor M1, the second transistor M2, the third transistor M3, the fourth transistor M4, the fifth transistor M5, the sixth transistor M6, the pull high transistor Mph, the pull low transistor Mpl, the clamp transistor Mclamp and the switch transistor Msw described above are MOSFETs.

Figure 7:
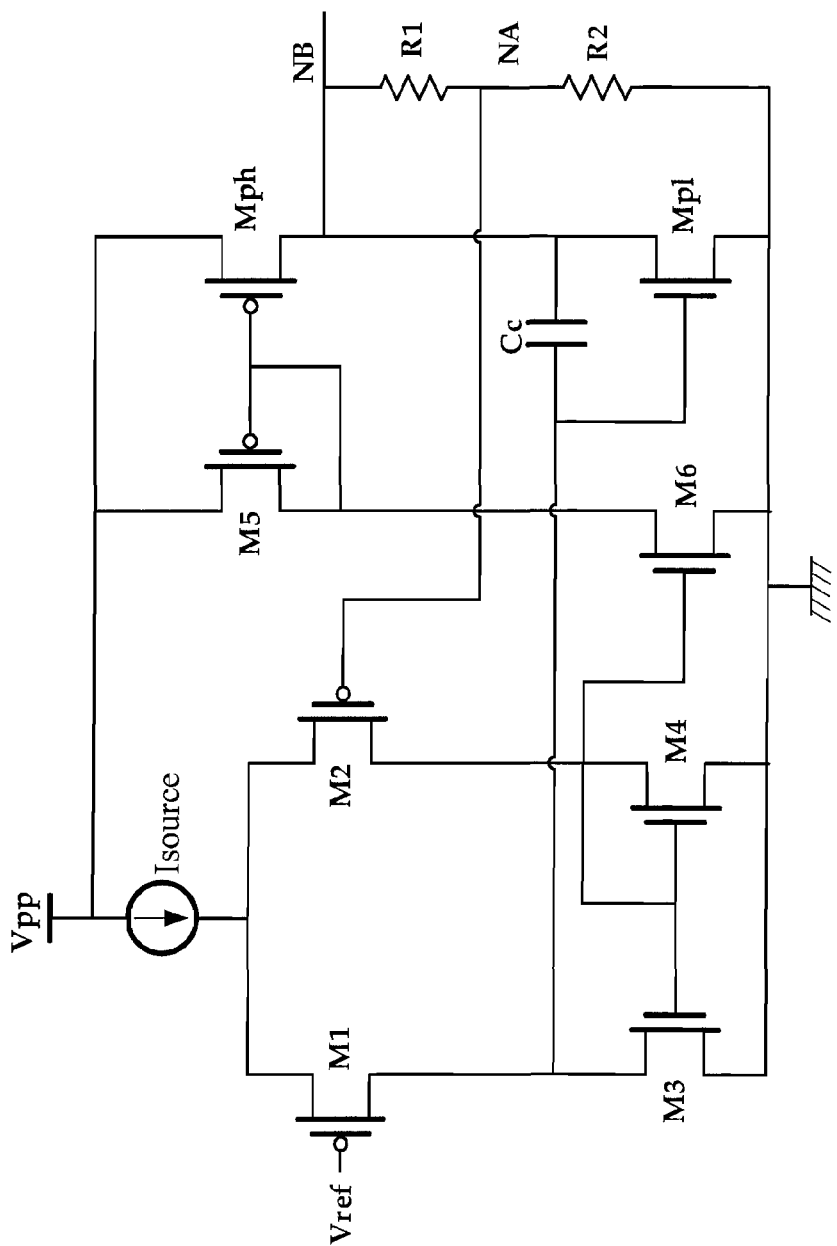
FIG. 7 is a circuit diagram of the discharge enhanced bias source according to a further preferred embodiment of the present invention.

Please refer to FIG. 7, which is a circuit diagram of the discharge enhanced bias source according to a further preferred embodiment of the present invention. The discharge enhanced bias source 31 includes a current source Isource, a first transistor M1, a second transistor M2, a third transistor M3, a fourth transistor M4, a fifth transistor M5, a sixth transistor M6, a pull high transistor Mph, a pull low transistor Mpl, a capacitor of Miller compensation Cc and resistors R1, R2. The input terminal of the current source Isource receives a voltage Vpp, and the output terminal thereof is connected to the drain of the first transistor M1 and the drain of the second transistor M2 respectively. The gate of the first transistor M1 receives a reference voltage Vref, and the source thereof is connected to the drain of the third transistor M3. The gate of the second transistor M2 is connected between the resistors R1, R2, and the source thereof is connected to the drain of the fourth transistor M4. The gate of the third transistor M3 is connected to the gate of the fourth transistor M4, and the source thereof is connected to ground. The gate of the fourth transistor M4 is connected to the gate of the third transistor M3, and the source thereof is connected to ground. The gate of the fifth transistor M5 is connected to the source thereof, the drain thereof receives the voltage Vpp, and the source thereof is connected to the drain of the sixth transistor M6. The gate of the sixth transistor M6 is connected to the gate of the third transistor M3, and the source thereof is connected to ground. The gate of the pull high transistor Mph is connected to the gate of the fifth transistor M5, the drain thereof receives the voltage Vpp, and the source thereof is connected to the drain of the pull low transistor Mpl. The gate of the pull low transistor Mpl is connected to the drain of the third transistor M3, and the source thereof is connected to ground. The coupling capacitor Cc is connected between the gate and the drain of the pull low transistor Mpl. A first terminal of the resistor R1 is connected to the source of the pull high transistor Mph, a second terminal thereof is connected to a first terminal of the resistor R2. A second terminal of the resistor R2 is connected to ground.

The first transistor M1, the second transistor M2, the third transistor M3, the fourth transistor M4, the fifth transistor M5, the sixth transistor M6, the pull high transistor Mph, the pull low transistor Mpl, the clamp transistor Mclamp and the switch transistor Msw described above are MOSFETs.

In conclusion, the present invention uses a discharge enhanced bias source and a low couple effect switch unit to obtain a low couple effect bit-line voltage. Through the present invention, a stable bias applied to the bit-line of the memory array is obtained which is applicable to all memories, for example a flash memory. Therefore, the present invention effectively solves the problems and drawbacks in the prior art, and thus it fits the demand of the industry and is industrially valuable.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A bit-line voltage generator, comprising:
   a discharge enhanced bias source; and
   a switch unit, comprising:
      a clamp transistor having a source, a gate connected to the discharge enhanced bias source, and a drain receiving a voltage;
      a switch transistor having a gate receiving a control signal, a drain connected to the source of the clamp transistor, and a source connected to a memory array, wherein a parasitic capacitor exists between the gate and the source of the clamp transistor;
      a resistor having a first terminal connected to the drain of the switch transistor, and a second terminal connected to ground; and
      a capacitor having a first terminal connected to the drain of the switch transistor, and a second terminal connected to ground,
   wherein a charge in the parasitic capacitor, when the switch transistor is turned on, is almost identical to that when the switch transistor is turned off, so that a couple effect between the switch unit and
   the discharge enhanced bias source is reduced, thereby stabilizing a bias applied to the memory array.

2. The bit-line voltage generator as claimed in claim 1, wherein the discharge enhanced bias source comprises:
   an operational amplifier having a noninverting input terminal receiving a reference voltage;
   a first diode having an anode connected to an output terminal of the operational amplifier;
   a second diode having an anode connected to a cathode of the first diode;
   a current source having an input terminal connected to a cathode of the second diode, and an output terminal connected to ground;
   a pull low transistor having a gate connected to the input terminal of the current source, and a source connected to the output terminal of the current source;
   a pull high transistor having a gate connected to an output terminal of the operational amplifier, a drain receiving to the voltage, and a source connected to a drain of the pull low transistor;
   a first resistor having a first terminal connected to the source of the pull high transistor, and a second terminal connected to an inverting input terminal of the operational amplifier; and
   a second resistor having a first terminal connected to the inverting input terminal of the operational amplifier, and a second terminal connected to ground.

3. The bit-line voltage generator as claimed in claim 2, wherein the first diode, the second diode, the current source, the pull high transistor and the pull low transistor constitutes a class AB output stage.

4. The bit-line voltage generator as claimed in claim 2, wherein the source of the pull high transistor is connected to the gate of the clamp transistor.

5. The bit-line voltage generator as claimed in claim 1, wherein the discharge enhanced bias source comprises:
   a current source having an output terminal connected to ground;

a first transistor having a source connected to an input terminal of the current source;

a second transistor having a gate receiving a reference voltage, and a source connected to an input terminal of the current source;

a third transistor having a gate connected to a source thereof, a drain receiving the voltage, and the source connected to a drain of the first transistor;

a fourth transistor having a gate connected to a source thereof, a drain receiving the voltage, and the source connected to a drain of the second transistor;

a fifth transistor having a gate connected to the gate of the third transistor, and a drain receiving the voltage;

a sixth transistor having a gate connected to a drain thereof, the drain connected to a source of the fifth transistor, and a source connected to ground;

a pull high transistor having a gate connected to the gate of the fourth transistor, and a drain receiving the voltage;

a pull low transistor having a gate connected to the gate of the sixth transistor, a drain connected to a source of the pull high transistor, and a source connected to ground;

a first resistor having a first terminal connected to a source of the pull high transistor, and a second terminal connected to a gate of the first transistor; and a second resistor having a first terminal connected to the second terminal of the first resistor, and a second terminal connected to ground.

6. The bit-line voltage generator as claimed in claim 5, wherein the source of the pull high transistor is connected to the gate of the clamp transistor.

7. The bit-line voltage generator as claimed in claim 1, wherein the discharge enhanced bias source comprises:

a current source having an input terminal receiving the voltage;

a first transistor having a gate receiving a reference voltage, and a drain connected to an output terminal of the current source;

a second transistor having a drain connected to the output terminal of the current source;

a third transistor having a drain connected to a source of the first transistor, and a source connected to ground;

a fourth transistor having a gate connected to a gate of the third transistor, a drain connected to a source of the second transistor, and a source connected to ground;

a fifth transistor having a gate connected to a source thereof, and a drain receiving the voltage;

a sixth transistor having a gate connected to the gate of the third transistor, a drain connected to the source of the fifth transistor, and a source connected to ground;

a pull high transistor having a gate connected to the gate of the fifth transistor, and a drain receiving the voltage;

a pull low transistor having a gate connected to the drain of the third transistor, a drain connected to a source of the pull high transistor, and a source connected to ground;

a coupling capacitor connected between the gate and the drain of the pull low transistor;

a first resistor having a first terminal connected to the source of the pull high transistor, and a second terminal connected to a gate of the second transistor; and a second resistor having a first terminal connected to the second terminal of the first resistor, and a second terminal connected to ground.

8. The bit-line voltage generator as claimed in claim 7, wherein the source of the pull high transistor is connected to the gate of the clamp transistor.

9. The bit-line voltage generator as claimed in claim 1, wherein the source of the switch transistor is connected to a bit-line of the memory array.

10. A switch unit, comprising:

a first transistor having a source, a gate connected to a discharge enhanced bias source, and a drain receiving a voltage;

a second transistor having a gate receiving a control signal, a drain connected to the source of the first transistor, and a source connected to a memory array, wherein a parasitic capacitor exists between the gate and the source of the first transistor;

a resistor having a first terminal connected to the drain of the second transistor, and a second terminal connected to ground; and a capacitor having a first terminal connected to the drain of the second transistor, and a second terminal connected to ground, wherein a charge in the parasitic capacitor, when the second transistor is turned on, is almost identical to that when the second transistor is turned off, so that a couple effect between the switch unit and the discharge enhanced bias source is reduced, thereby stabilizing a bias applied to the memory array.

11. The switch unit as claimed in claim 10, wherein the source of the second transistor is connected to a bit-line of the memory array.

12. A bit-line voltage generator, comprising:

a discharge enhanced bias source; and a switch unit having a circuit unit and a parasitic capacitor coupled between the circuit unit and the discharge enhanced bias source, and connected between the discharged enhanced bias source and a memory array, wherein the circuit unit makes a charge in the parasitic capacitor, when the switch transistor is turned on, almost identical to that when the switch transistor is turned off, so that a couple effect between the switch unit and the discharge enhanced bias source is reduced, thereby stabilizing a bias applied to the memory array.

13. The bit-line voltage generator as claimed in claim 12, wherein the switch unit is connected to a bit-line of the memory array.

* * * * *